United States Patent
Ohmaru et al.

(10) Patent No.: US 8,587,270 B2
(45) Date of Patent: Nov. 19, 2013

(54) PWM LIMITER CIRCUIT HAVING COMPARATOR AND SWITCH, AND SEMICONDUCTOR DEVICE USING THE SAME

(75) Inventors: Takuro Ohmaru, Kanagawa (JP); Yoshiaki Ito, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 395 days.

(21) Appl. No.: 12/912,985

(22) Filed: Oct. 27, 2010

(65) Prior Publication Data

US 2011/0095787 A1    Apr. 28, 2011

(30) Foreign Application Priority Data

Oct. 28, 2009    (JP) ................................. 2009-247700

(51) Int. Cl.
    *G05F 1/00*    (2006.01)
    *G01R 29/02*   (2006.01)
    *H03K 9/08*    (2006.01)

(52) U.S. Cl.
    USPC .......................................... 323/271; 327/35

(58) Field of Classification Search
    USPC .......................................... 323/271; 327/35
    See application file for complete search history.

(56) References Cited

U.S. PATENT DOCUMENTS

| | | | |
|---|---|---|---|
| 4,769,753 A | 9/1988 | Knudson et al. | |
| 4,914,375 A | 4/1990 | Hatanaka | |
| 5,727,193 A | 3/1998 | Takeuchi | |
| 6,724,156 B2 | 4/2004 | Fregoso | |
| 6,934,645 B2 * | 8/2005 | Kim .............................. | 702/64 |
| 6,940,482 B2 | 9/2005 | Ishii et al. | |
| 2002/0060560 A1 | 5/2002 | Umemoto | |
| 2002/0185994 A1 | 12/2002 | Kanouda et al. | |
| 2003/0043090 A1 | 3/2003 | Yazawa et al. | |
| 2003/0160744 A1 | 8/2003 | Yoshida et al. | |
| 2003/0197494 A1 | 10/2003 | Kanouda et al. | |
| 2004/0080501 A1 | 4/2004 | Koyama | |
| 2005/0012698 A1 | 1/2005 | Takahashi | |

(Continued)

FOREIGN PATENT DOCUMENTS

JP    6-348220    12/1994
JP    8-44465     2/1996

(Continued)

OTHER PUBLICATIONS

International Search Report re application No. PCT/JP2010/067606, dated Dec. 14, 2010.
Written Opinion re application No. PCT/JP2010/067606, dated Dec. 14, 2010.

*Primary Examiner* — Adolf Berhane
*Assistant Examiner* — Emily P Pham
(74) *Attorney, Agent, or Firm* — Husch Blackwell LLP

(57) ABSTRACT

The duty ratio of a PWM signal is prevented from being zero immediately after the start of PWM control, for example. A PWM limiter circuit has a structure with which a signal output from the PWM limiter circuit can be prevented from being higher than a certain value or lower than a certain value. The PWM limiter circuit includes a comparator circuit, a controller circuit, and a switch circuit. The highest duty ratio reference voltage $V_{refH}$ is input to a first input terminal. The lowest duty ratio reference voltage $V_{refL}$ is input to a second input terminal. Voltage $V_{err}$ output from an error amplifier is input to a third input terminal.

4 Claims, 6 Drawing Sheets

(56) References Cited

U.S. PATENT DOCUMENTS

| | | |
|---|---|---|
| 2005/0110719 A1 | 5/2005 | Satoh et al. |
| 2005/0116655 A1 | 6/2005 | Yazawa |
| 2007/0029977 A1 | 2/2007 | Asada |
| 2009/0009505 A1 | 1/2009 | Koyama |

FOREIGN PATENT DOCUMENTS

| | | |
|---|---|---|
| JP | 10-127047 | 5/1998 |
| JP | 2000-166129 | 6/2000 |
| JP | 2002-369505 | 12/2002 |
| JP | 2009-200372 | 9/2009 |

* cited by examiner

PWM LIMITER CIRCUIT HAVING COMPARATOR AND SWITCH, AND SEMICONDUCTOR DEVICE USING THE SAME

TECHNICAL FIELD

The technical field of the present invention relates to a PWM limiter circuit applicable to a power supply circuit or the like (e.g., a switching regulator).

BACKGROUND ART

Pulse width modulation (PWM) control used in a power supply circuit raises or lowers input voltage by a change in duty ratio of a PWM signal.

FIG. 5 illustrates a structure example of a PWM control circuit. The PWM control circuit includes an error amplifier 50, a reference voltage generation circuit 60, a PWM limiter circuit 70, an oscillator 80 for generating a triangle wave, and a PWM comparator 90.

The error amplifier 50 amplifies a difference between feedback voltage $V_{fb}$ and reference voltage and outputs voltage $V_{err}$.

The reference voltage generation circuit 60 generates the reference voltage and reference voltage $V_{ref}$.

The PWM limiter circuit 70 controls its output voltage $V_{ers}$ by comparing the voltage $V_{err}$ output from the error amplifier 50 and the reference voltage $V_{ref}$ with each other.

The oscillator 80 generates a triangle wave $V_{osc}$ that is a signal needed for generation of a PWM signal.

The PWM comparator 90 outputs a PWM signal from the voltage $V_{ers}$ output from the PWM limiter circuit 70 and the triangle wave $V_{osc}$, generated in the oscillator 80.

In PWM control, when a duty ratio represented by a ratio of the pulse width of a PWM signal to the cycle of the PWM signal is higher than or equal to a certain ratio (80%), harmonic noise might be generated. Further, an element might be damaged by supply of excessive current.

Therefore, in order to perform PWM control without the above problems, it is necessary to perform limiter control for preventing the duty ratio of a PWM signal from being higher than a certain ratio.

Reference 1 discloses a method for controlling the duty ratio of a PWM signal by input of the highest duty ratio voltage to a comparator when voltage output from an error amplifier is higher than the highest duty ratio voltage as a method of limiter control.

REFERENCE

Reference 1: Japanese Published Patent Application No. H10-127047

DISCLOSURE OF INVENTION

Even in the case where limiter control is performed in order to prevent the duty ratio of a PWM signal from being higher than a certain ratio, the duty ratio of the PWM signal is zero immediately after the start of PWM control, so that problems such as generation of noise due to ringing of current flowing through a coil and unstable operation of a constant voltage control circuit occur.

Similarly, in the case where PWM control is performed using a device where input voltage greatly fluctuates, such as a solar cell, as a power source, the duty ratio of a PWM signal is zero.

A PWM limiter circuit has a structure with which a signal output from the PWM limiter circuit can be prevented from being higher than a certain value or lower than a certain value.

One embodiment of the present invention is a PWM limiter circuit. The PWM limiter circuit includes a first terminal to which the highest duty ratio reference voltage is input, a second terminal to which the lowest duty ratio reference voltage is input, a comparator for comparing a voltage input to a third terminal and the highest duty ratio reference voltage with each other, a comparator for comparing the voltage input to the third terminal and the lowest duty ratio reference voltage with each other, a first switch which is turned on when the voltage input to the third terminal is higher than the highest duty ratio reference voltage, a second switch which is turned on when the voltage input to the third terminal is lower than the lowest duty ratio reference voltage, a third switch which is turned on when the voltage input to the third terminal is higher than the lowest duty ratio reference voltage and lower than the highest duty ratio reference voltage, and an output terminal which is electrically connected to the first switch, the second switch, and the third switch.

By control of a PWM signal so that the duty ratio of the PWM signal is prevented from being zero, generation of noise can be suppressed and unstable operation can be prevented.

BEST MODE FOR CARRYING OUT THE INVENTION

Hereinafter, embodiments of the disclosed invention will be described with reference to the drawings. Note that the disclosed invention is not limited to the following description. It will be readily appreciated by those skilled in the art that modes and details of the disclosed invention can be changed in various ways without departing from the spirit and scope of the disclosed invention. Therefore, the disclosed invention should not be construed as being limited to the following description of the embodiments.

Embodiment 1

Figure 1:
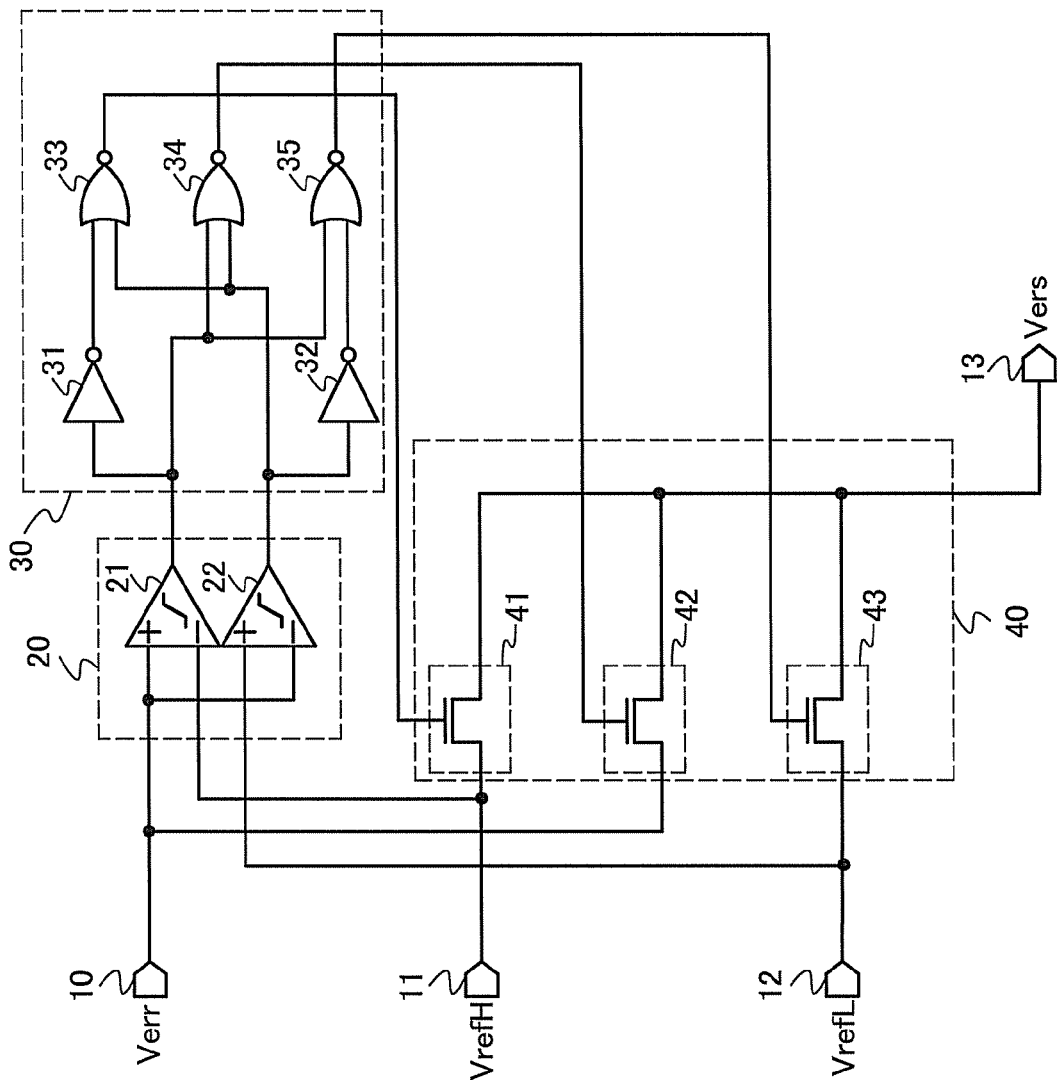
FIG. 1 is a circuit diagram of a PWM limiter circuit.

FIG. 1 is a circuit diagram of a PWM limiter circuit in this embodiment. The PWM limiter circuit includes a comparator circuit 20, a controller circuit 30, and a switch circuit 40.

Voltage $V_{err}$ output from an error amplifier is input to an input terminal 10.

The highest duty ratio reference voltage $V_{refH}$ is input to an input terminal 11.

The lowest duty ratio reference voltage $V_{refL}$ is input to an input terminal 12.

A circuit for outputting the highest duty ratio reference voltage $V_{refH}$ and the lowest duty ratio reference voltage $V_{refL}$ may be an operational amplifier.

The comparator circuit 20 compares the voltage $V_{err}$ output from the error amplifier with the highest duty ratio reference voltage $V_{refH}$ or the lowest duty ratio reference voltage $V_{refL}$.

The comparator circuit 20 includes comparators 21 and 22.

The voltage $V_{err}$ output from the error amplifier is input to a noninversion input terminal of the comparator 21. The highest duty ratio reference voltage $V_{refH}$ is input to an inversion input terminal of the comparator 21.

The lowest duty ratio reference voltage $V_{refL}$ is input to a noninversion input terminal of the comparator 22. The voltage $V_{err}$ output from the error amplifier is input to an inversion input terminal of the comparator 22.

The controller circuit 30 generates a signal for controlling a signal output from the comparator circuit 20 with the switch circuit 40.

The controller circuit 30 includes NOT gates 31 and 32 and NOR gates 33 to 35.

The switch circuit 40 includes switches 41 to 43. Here, the switches 41 to 43 are MOS switches including NMOS transistors.

Here, the transistors included in the switch circuit 40 are thin film transistors including silicon in channel layers. Note that the transistors included in the switch circuit 40 are not limited to single-gate transistors. Multi-gate transistors such as double-gate transistors may be used.

Further, the channel layers of the transistors included in the switch circuit 40 are not limited to silicon. An oxide semiconductor or the like may be used.

Note that the switches 41 to 43 are not limited to having these structures as long as on states and off states of the switches 41 to 43 are switched in response to a signal from the controller circuit 30.

Voltage $V_{ers}$ output from the PWM limiter circuit is output to an output terminal 13.

Next, a method for controlling a PWM signal with the PWM limiter circuit is described.

The duty ratio of a PWM signal is controlled in such a manner that the voltage $V_{err}$ output from the error amplifier and a triangle wave $V_{osc}$ are compared with each other in a PWM comparator and the difference therebetween is amplified.

The PWM comparator compares the voltage $V_{err}$ output from the error amplifier and the triangle wave $V_{osc}$ with each other. In the case where the signal level of the triangle wave $V_{osc}$ is higher than the voltage $V_{err}$ output from the error amplifier, an H-level (a high-level) signal is output as a PWM signal. In contrast, in the case where the signal level of the triangle wave $V_{osc}$ is lower than the voltage $V_{err}$ output from the error amplifier, an L-level (a low-level) signal is output as the PWM signal.

In the case where the voltage $V_{err}$ output from the error amplifier is lower than the triangle wave $V_{osc}$, the PWM signal does not have a duty ratio. Similarly, in the case where the voltage $V_{err}$ output from the error amplifier is higher than the triangle wave $V_{osc}$, the PWM signal does not have a duty ratio.

First, the case where the voltage $V_{err}$ output from the error amplifier is lower than the lowest duty ratio reference voltage $V_{refL}$ is described.

In this case, the switch 43 is turned on, and the lowest duty ratio reference voltage $V_{refL}$ is output as the voltage $V_{ers}$ output from the PWM limiter circuit.

Figure 3A:
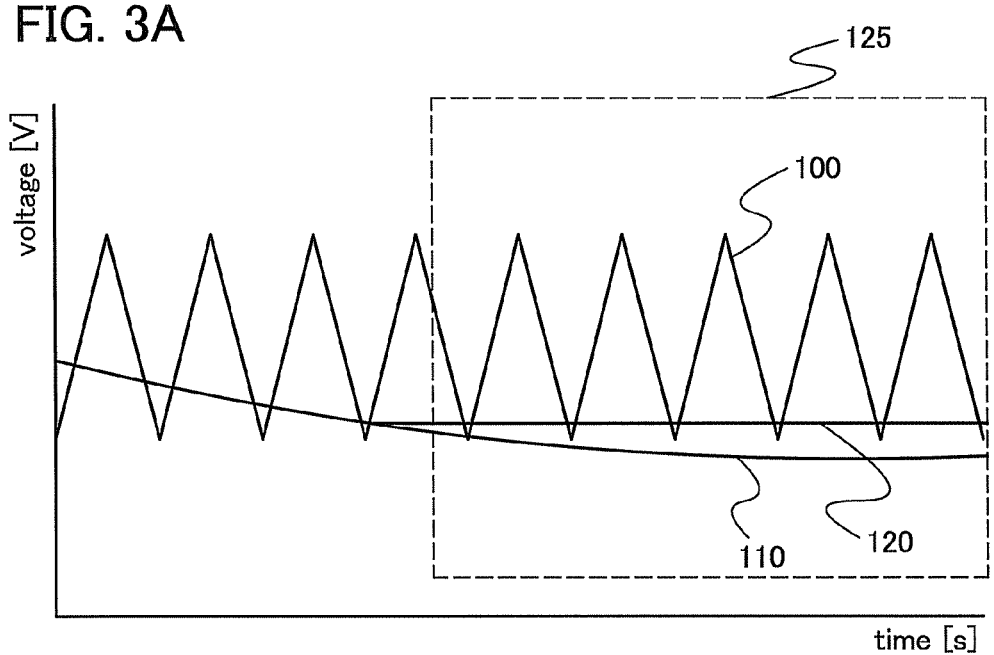
FIGS. 3A and 3B are graphs illustrating generation of a PWM signal when voltage $V_{err}$ output from an error amplifier is sometimes lower than the lowest duty ratio reference voltage $V_{refL}$.
Figure 3B:
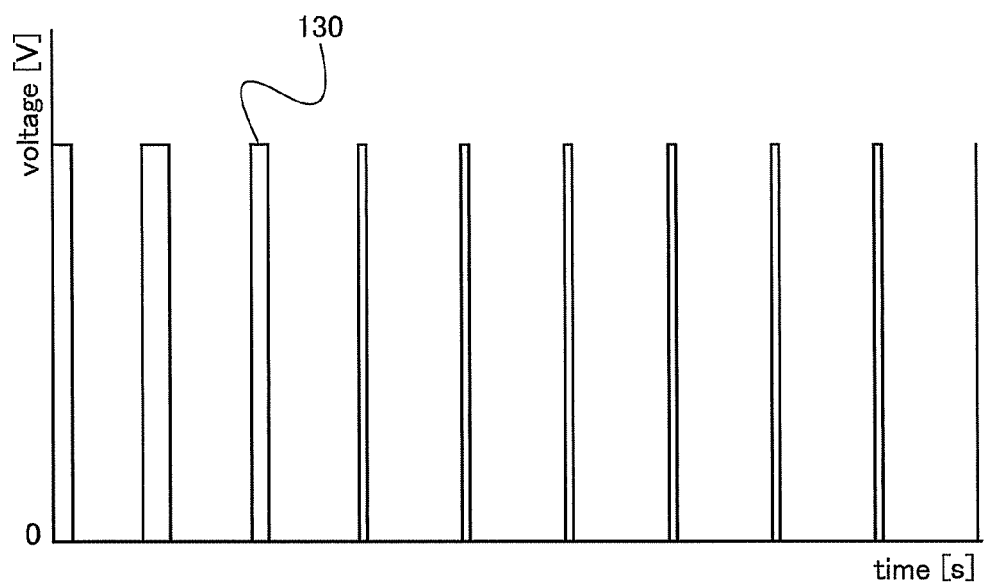

FIGS. 3A and 3B are graphs illustrating generation of a PWM signal when the voltage $V_{err}$ output from the error amplifier is sometimes lower than the lowest duty ratio reference voltage $V_{refL}$.

In FIG. 3A, the vertical axis indicates voltage [V] and the horizontal axis indicates time [s]. A line 100 indicates the triangle wave $V_{osc}$. A line 110 indicates the voltage $V_{err}$ output from the error amplifier. A line 120 indicates the lowest duty ratio reference voltage $V_{refL}$.

In FIG. 3B, the vertical axis indicates voltage [V] and the horizontal axis indicates time [s]. A line 130 indicates a PWM signal generated from the triangle wave and the voltage output from the error amplifier or the lowest duty ratio reference voltage in FIG. 3A.

In a region 125 in FIG. 3A, the voltage $V_{err}$ output from the error amplifier is lower than the lowest duty ratio reference voltage $V_{refL}$. Therefore, the lowest duty ratio reference voltage $V_{refL}$ is output as the voltage $V_{ers}$ output from the PWM limiter circuit.

Next, the case where the voltage $V_{err}$ output from the error amplifier is higher than the highest duty ratio reference voltage $V_{refH}$ is described.

In this case, the switch 41 is turned on, and the highest duty ratio reference voltage $V_{refH}$ is output as the voltage $V_{ers}$ output from the PWM limiter circuit.

Figure 4A:
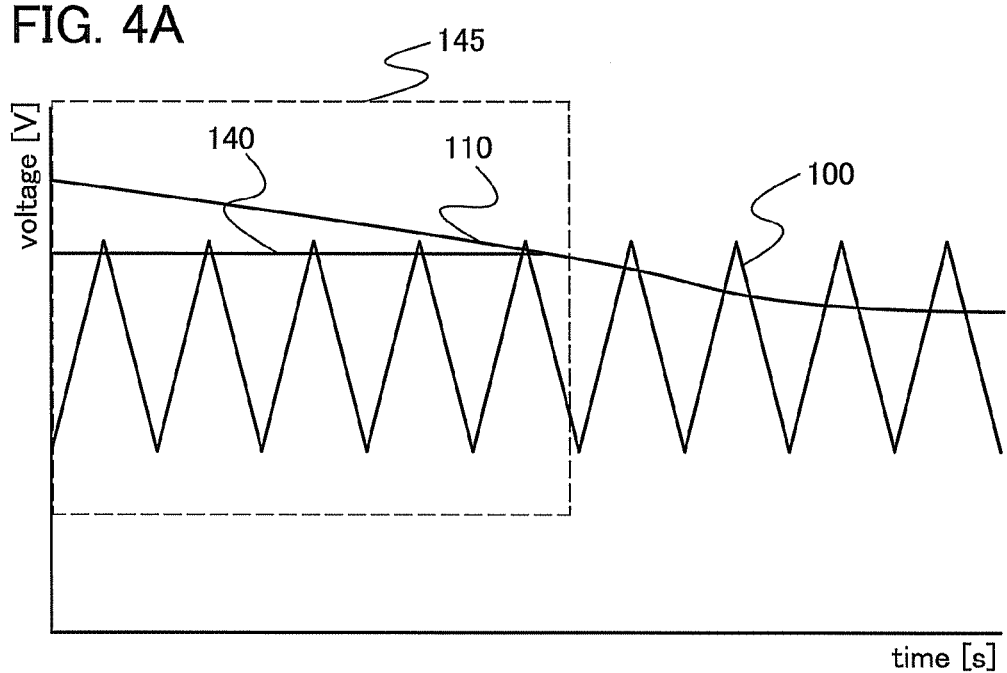
FIGS. 4A and 4B are graphs illustrating generation of a PWM signal when voltage $V_{err}$ output from an error amplifier is sometimes higher than the highest duty ratio reference voltage $V_{refH}$.
Figure 4B:
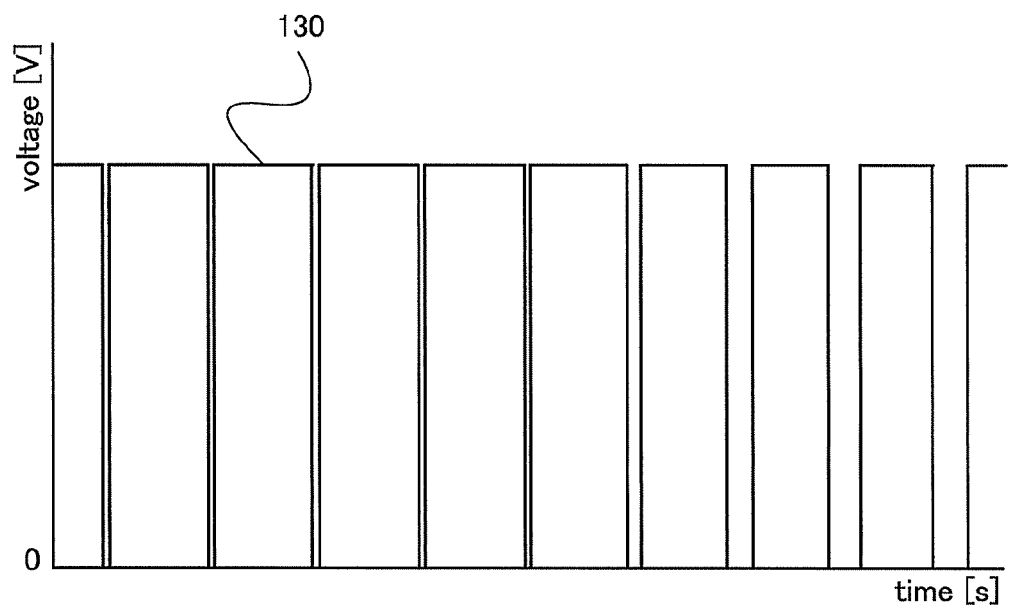

FIGS. 4A and 4B are graphs illustrating generation of a PWM signal when the voltage $V_{err}$ output from the error amplifier is sometimes higher than the highest duty ratio reference voltage $V_{refH}$.

In FIG. 4A, the vertical axis indicates voltage [V] and the horizontal axis indicates time [s]. The line 100 indicates the triangle wave $V_{osc}$. The line 110 indicates the voltage $V_{err}$ output from the error amplifier. A line 140 indicates the highest duty ratio reference voltage $V_{refH}$.

In FIG. 4B, the vertical axis indicates voltage [V] and the horizontal axis indicates time [s]. The line 130 indicates a PWM signal generated from the triangle wave and the voltage output from the error amplifier or the highest duty ratio reference voltage in FIG. 4A.

In a region 145 in FIG. 4A, the voltage $V_{err}$ output from the error amplifier is higher than the highest duty ratio reference voltage $V_{refH}$. Therefore, the highest duty ratio reference voltage $V_{refH}$ is output as the voltage $V_{ers}$ output from the PWM limiter circuit.

Finally, the case where the voltage $V_{err}$ output from the error amplifier is higher than the lowest duty ratio reference voltage $V_{refL}$ and lower than the highest duty ratio reference voltage $V_{refH}$ is described.

In this case, the switch 42 is turned on, and the voltage $V_{err}$ output from the error amplifier is output as the voltage $V_{ers}$ output from the PWM limiter circuit.

Through the above control, the voltage $V_{ers}$ output from the PWM limiter circuit always exists in the amplitude of the triangle wave $V_{osc}$, so that a PWM signal always has a duty ratio.

Embodiment 2

Figure 2:
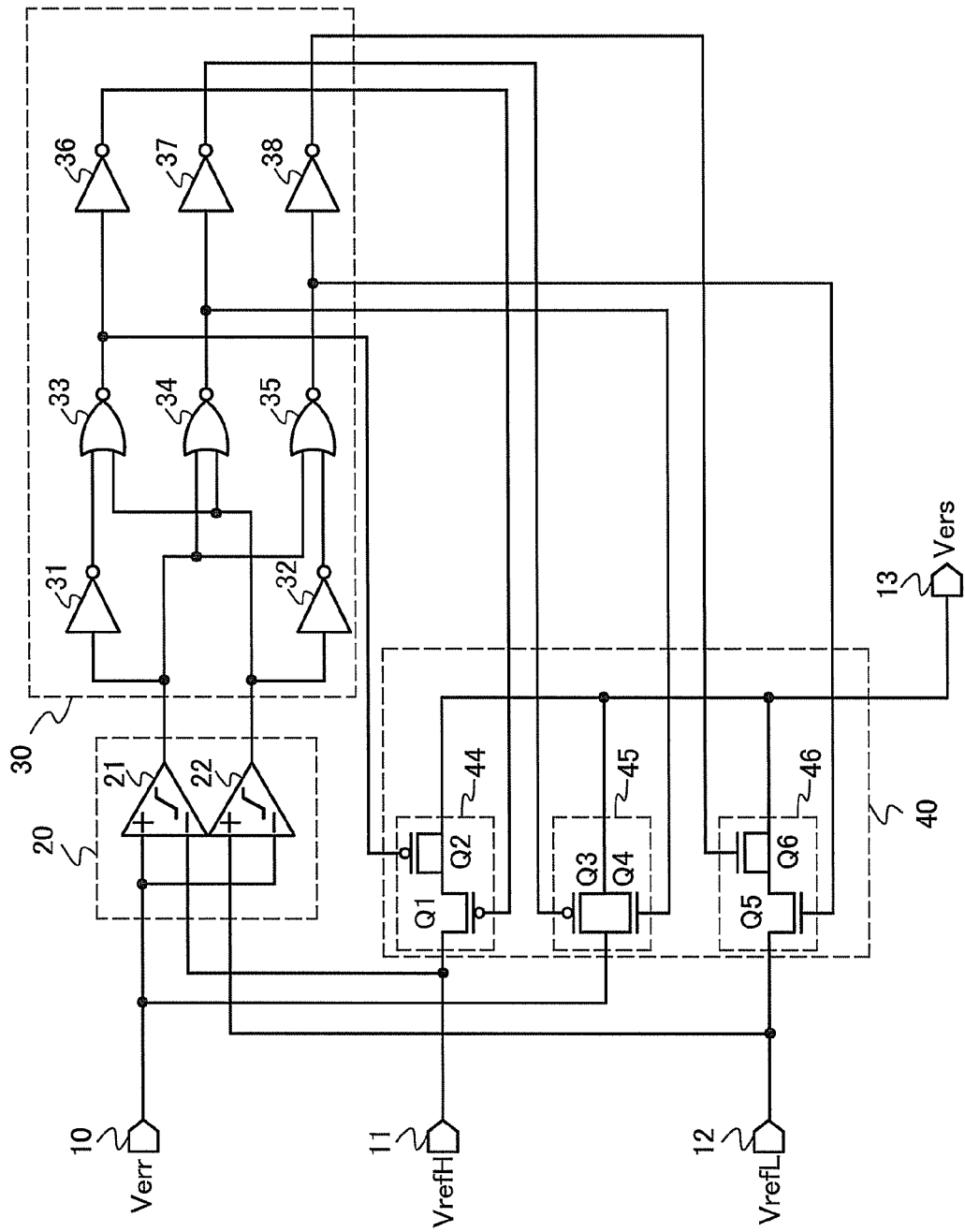
FIG. 2 is a circuit diagram of a PWM limiter circuit.

FIG. 2 is a circuit diagram of a PWM limiter circuit in this embodiment. The PWM limiter circuit differs from the PWM limiter circuit in FIG. 1 in the structures of the switch circuit 40 and the controller circuit 30.

A switch 44 is a MOS switch including a PMOS transistor Q1. A PMOS transistor Q2 whose source and drain are short-circuited is provided as a dummy switch for compensating feedthrough electric charge from a gate when the PMOS transistor Q1 is turned off.

The PMOS transistor Q1 which is a MOS switch and the PMOS transistor Q2 which is a dummy switch are driven with pulses whose phases are opposite. Thus, a NOT gate 36 is provided in the controller circuit 30.

A switch 45 is a MOS switch (a transmission gate) including a PMOS transistor Q3 and an NMOS transistor Q4. A NOT gate 37 is provided in the controller circuit 30 in order to drive the switch 45.

A switch 46 is a MOS switch including an NMOS transistor Q5, to which an NMOS transistor Q6 is added as a dummy switch. A NOT gate 38 is provided in the controller circuit 30 in order to drive the switch 46.

The polarities of the transistors used as the MOS switches are not limited to them; however, it is advantageous to connect the switch 44 which is the MOS switch including the PMOS transistor Q1 to the input terminal 11 to which the highest duty ratio reference voltage $V_{refH}$ is input. The advantage of the above structure is that gate-source voltage ($V_{gs}$) of the PMOS transistor Q1 is raised and source-drain resistance ($R_{ds}$) is lowered.

Similarly, when the switch 46 which is the MOS switch including the NMOS transistor Q5 is connected to the input terminal 12 to which the lowest duty ratio reference voltage $V_{refL}$ is input, gate-source voltage ($V_{gs}$) of the NMOS transistor Q5 is raised and source-drain resistance ($R_{ds}$) is lowered, which is effective.

Note that a method for controlling a PWM signal with the PWM limiter circuit in FIG. 2 is similar to a method for controlling a PWM signal with the PWM limiter circuit in FIG. 1.

Embodiment 3

Figure 6:
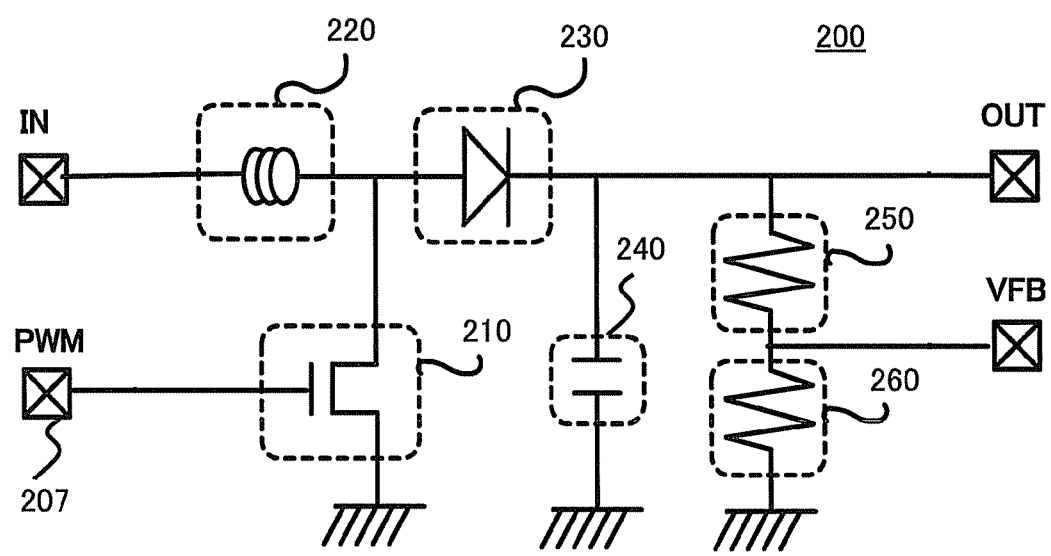
FIG. 6 is a circuit diagram illustrating a structure example of DC-DC converter including a PWM control circuit.

FIG. 6 is a circuit diagram of a DC-DC converter which includes a PWM control circuit having the PWM limiter circuit described in Embodiments 1 and 2.

A DC-DC converter 200 described in this embodiment includes a power transistor 210, a coil 220, a diode 230, a capacitor 240, a resistor 250, a resistor 260, and a PWM control circuit 270. In the DC-DC converter 200, voltage obtained by division of output voltage is monitored with the PWM control circuit 270, and the level of the output voltage is set to a desired level.

Figure 5:
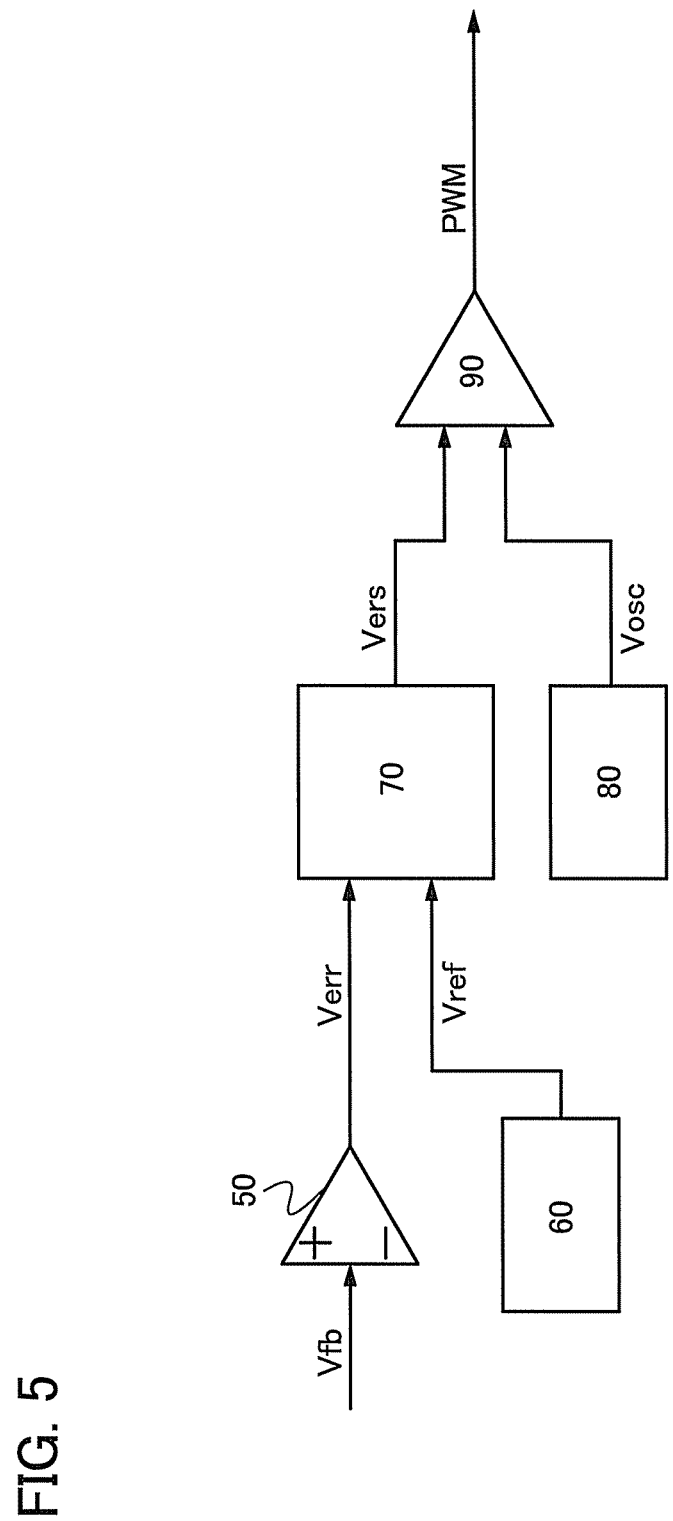
FIG. 5 is a circuit diagram illustrating a structure example of a PWM control circuit.

The PWM control circuit 270 controls a PWM signal used for driving the power transistor 210. The structure of the PWM control circuit 270 is similar to that of the circuit illustrated in FIG. 5. The PWM limiter circuit included in the PWM control circuit 270 controls the upper and lower limits of the duty ratio of a PWM signal. The structure of the PWM limiter circuit in this embodiment is similar to those of FIG. 1 and FIG. 2. Further, a method for controlling a PWM signal with the PWM limiter circuit is similar to those of Embodiments 1 and 2; thus, description of such a method is omitted.

This application is based on Japanese Patent Application serial No. 2009-247700 filed with Japan Patent Office on Oct. 28, 2009, the entire contents of which are hereby incorporated by reference.

The invention claimed is:

1. A PWM limiter circuit comprising:
a first terminal to which highest duty ratio reference voltage is input;
a second terminal to which lowest duty ratio reference voltage is input;
a comparator for comparing a voltage input to a third terminal with the highest duty ratio reference voltage or the lowest duty ratio reference voltage;
a controller circuit electrically connected to the comparator;
a first switch which is turned on when the voltage input to the third terminal is higher than the highest duty ratio reference voltage;
a second switch which is turned on when the voltage input to the third terminal is lower than the lowest duty ratio reference voltage;
a third switch which is turned on when the voltage input to the third terminal is higher than the lowest duty ratio reference voltage and lower than the highest duty ratio reference voltage; and
an output terminal electrically connected to the first switch, the second switch, and the third switch,
wherein the first switch comprises a first transistor and a second transistor whose source and drain are short-circuited,
wherein the second switch is a transmission gate comprising a third transistor and a fourth transistor,
wherein the third switch comprises a fifth transistor and a sixth transistor whose source and drain are short-circuited,
wherein gates of the first transistor, the second transistor, the third transistor, the fourth transistor, the fifth transistor and the sixth transistor are electrically connected to the controller circuit, and
wherein one of a source or a drain of the first transistor is electrically connected to the first terminal, one of a source or a drain of the third transistor and one of a source or a drain of the fourth transistor are electrically connected to the second terminal, and one of a source or a drain of the fifth transistor is electrically connected to the third terminal.

2. The PWM limiter circuit according to claim 1, wherein each of the first transistor and the second transistor is a p-channel transistor, and
wherein each of the fifth transistor and the sixth transistor is an n-channel transistor.

3. A DC-DC converter comprising:
a PWM control circuit comprising:
a PWM limiter circuit comprising:
a first terminal to which highest duty ratio reference voltage is input;
a second terminal to which lowest duty ratio reference voltage is input;
a comparator for comparing a voltage input to a third terminal with the highest duty ratio reference voltage or the lowest duty ratio reference voltage;
a controller circuit electrically connected to the comparator;
a first switch which is turned on when the voltage input to the third terminal is higher than the highest duty ratio reference voltage;
a second switch which is turned on when the voltage input to the third terminal is lower than the lowest duty ratio reference voltage;
a third switch which is turned on when the voltage input to the third terminal is higher than the lowest duty ratio reference voltage and lower than the highest duty ratio reference voltage; and
an output terminal electrically connected to the first switch, the second switch, and the third switch,
wherein the first switch comprises a first transistor and a second transistor whose source and drain are short-circuited,
wherein the second switch is a transmission gate comprising a third transistor and a fourth transistor, wherein the third switch comprises a fifth transistor and a sixth transistor whose source and drain are short-circuited, wherein gates of the first transistor, the second transistor, the third transistor, the fourth transistor, the fifth transistor and the sixth transistor are electrically connected to the controller circuit, and wherein one of a source or a drain of the first transistor is electrically connected to the first terminal, one of a source or a drain of the third transistor and one of a source or a drain of the fourth transistor are electrically connected to the second terminal, and one of a source or a drain of the fifth transistor is electrically connected to the third terminal.

4. The DC-DC converter according to claim 3, wherein each of the first transistor and the second transistor is a p-channel transistor, and wherein each of the fifth transistor and the sixth transistor is an n-channel transistor.

* * * * *